United States Patent
Xiao (10) Patent No.: US 10,516,132 B2
(45) Date of Patent: Dec. 24, 2019

(54) INVERTED QUANTUM DOT LIGHT-EMITTING DIODE AND MANUFACTURING METHOD THEREOF

(71) Applicant: Shenzhen China Star Optoelectronics Semiconductor Display Technology Co., Ltd., Shenzhen (CN)

(72) Inventor: Yadan Xiao, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 52 days.

(21) Appl. No.: 15/578,248

(22) PCT Filed: Nov. 16, 2017

(86) PCT No.: PCT/CN2017/111429
§ 371 (c)(1),
(2) Date: Nov. 30, 2017

(87) PCT Pub. No.: WO2019/037307
PCT Pub. Date: Feb. 28, 2019

(65) Prior Publication Data
US 2019/0067618 A1    Feb. 28, 2019

(30) Foreign Application Priority Data
Aug. 24, 2017  (CN) .......................... 2017 1 0737308

(51) Int. Cl.
*H01L 51/50*    (2006.01)
*H01L 51/52*    (2006.01)
(Continued)

(52) U.S. Cl.
CPC ...... *H01L 51/5072* (2013.01); *H01L 51/5056* (2013.01); *H01L 51/5088* (2013.01);
(Continued)

(58) Field of Classification Search
CPC ............. H01L 51/5072; H01L 51/5056; H01L 51/5088; H01L 51/5234; H01L 51/56;
(Continued)

(56) References Cited

U.S. PATENT DOCUMENTS

2008/0246961 A1* 10/2008 Zhang .................... B82Y 20/00
                                                      356/317
2011/0091510 A1*  4/2011 Lele ....................... B82Y 30/00
                                                      424/400
(Continued)

FOREIGN PATENT DOCUMENTS

CN         102089897 A     6/2011
CN         102280546 A    12/2011
(Continued)

OTHER PUBLICATIONS

Machine Translation of prior art CN106531892 (Year: 2017).*

*Primary Examiner* — Dzung Tran
(74) *Attorney, Agent, or Firm* — Leong C. Lei (57) ABSTRACT

The present invention provides an inverted QD-LED and a manufacturing method thereof. The manufacturing method of an inverted QD-LED according to the present invention adopts a hydrothermal synthesis process to form a monocrystalline $TiO_2$ nanorod array film for serving as an electron transport layer, wherein a plurality of monocrystalline $TiO_2$ nanorods contained in the monocrystalline $TiO_2$ nanorod array film are arranged in an array so as not to readily get aggregated thereby overcoming the deficiencies of inhomogeneous film formation resulting from aggregation of $TiO_2$ nanometer particles, lowered electron transport efficiency,
(Continued)

and low light extraction efficiency, and thus ensuring high-efficiency electron transport rate of the electron transport layer, increasing scattering of light to heighten light extraction efficiency, and improve luminous efficiency and stability of a device. The inverted QD-LED according to the present invention involves a monocrystalline $TiO_2$ nanorod array film to serve as an electron transport layer, and thus demonstrates increased luminous efficiency and stability.

6 Claims, 4 Drawing Sheets

(51) Int. Cl.
*H01L 51/56* (2006.01)
*H01L 51/00* (2006.01)

(52) U.S. Cl.
CPC .......... *H01L 51/5234* (2013.01); *H01L 51/56* (2013.01); *H01L 51/0035* (2013.01); *H01L 51/0037* (2013.01); *H01L 51/0042* (2013.01); *H01L 51/502* (2013.01); *H01L 2251/301* (2013.01); *H01L 2251/308* (2013.01); *H01L 2251/5353* (2013.01); *H01L 2251/5369* (2013.01); *H01L 2251/558* (2013.01)

(58) Field of Classification Search
CPC ............. H01L 51/0035; H01L 51/0037; H01L 51/0042; H01L 51/502; H01L 2251/301; H01L 2251/308; H01L 2251/5353; H01L 2251/5369; H01L 2251/558
USPC ........................................................... 257/40
See application file for complete search history.

(56) References Cited

U.S. PATENT DOCUMENTS

| | | | | |
|---|---|---|---|---|
| 2011/0245074 | A1* | 10/2011 | Smith | B01J 23/30 502/309 |
| 2011/0291071 | A1* | 12/2011 | Kim | H01L 51/502 257/13 |
| 2012/0292594 | A1* | 11/2012 | Zhou | H01L 51/4233 257/13 |
| 2013/0079520 | A1* | 3/2013 | Liu | C01G 23/053 546/2 |
| 2014/0302627 | A1* | 10/2014 | Ko | H01L 51/502 438/35 |
| 2015/0162537 | A1* | 6/2015 | Song | H01L 51/0052 257/40 |
| 2016/0365478 | A1* | 12/2016 | Shim | H01L 33/0083 |

FOREIGN PATENT DOCUMENTS

| | | |
|---|---|---|
| CN | 105845834 A | 8/2016 |
| CN | 106531892 A | 3/2017 |
| KR | 20140025750 A | 3/2014 |

* cited by examiner

INVERTED QUANTUM DOT LIGHT-EMITTING DIODE AND MANUFACTURING METHOD THEREOF

BACKGROUND OF THE INVENTION

1. Field of the Invention

The present invention relates to the field of display technology, and more particular to an inverted quantum dot light-emitting diode (QD-LED) and a manufacturing method thereof.

2. The Related Arts

With the continuous development of the display technology, people increasingly demand higher and higher quality of displaying. Quantum dots (QDs) are nanometer semiconductor particles in the form of spheres or similar to spheres made of elements of II-VI groups or III-V groups, having a particle size between several nanometers and tens of nanometers. Since the particle size of QDs is less than or close to the exciton Bohr radius of the corresponding body material, an quantum confinement effect is generally involved, where the energy band structure is changed from quasi-continuity of the body material to the discrete structure of the quantum dot material, making the quantum dots exhibiting unique behavior of stimulated emission of light. When the size of the QDs is decreased, the energy band gap becomes increased so that the energy required for exciting the QDs and the energy released from the excited QDs returning back to the ground state are increased correspondingly, exhibiting a "blue-shifting" phenomenon of the excitation of the QDs and the fluorescent spectrum. By controlling the size of the QDs, the emission spectrum thereof may be made covering the entire range of visible light. For example, when the size of cadmium selenide is decreased from 6.6 nm to 2.0 nm, the luminescence wavelength "blue-shifts" from red light zone of 635 nm to blue light zone of 460 nm.

Quantum dot materials have advantages, such as concentrated luminescence spectrum, high color purity, and luminescence color being easily adjustable through the size, structure, or composition of the quantum dot materials. Such advantages allow for applications in display devices to effectively improve the color gamut and color restorability of the display devices.

Quantum dots of a core-shell structure show extremely high luminous efficiency, adjustable luminescent spectrum, and extremely narrow half-peak width and also demonstrate better photo-chemical stability and applicability to solution based manufacturing processes, and are thus makeable on a flexible backing to form a QD-LED. A typical inverted QD-LED is generally made up of a cathode, an electron transport layer (ETL), a QD emissive layer, a hole transport layer (HTL), a hole inject layer (HIL), and an anode that are stacked in sequence from bottom to top. Inverted QD-LEDs that are currently available and demonstrate better performance are of organic-inorganic hybrid structures, in which the HTL and the HIL are both organic materials, while the ETL is inorganic metal oxide, such as nanometer particles of ZnO or $TiO_2$. Although ZnO or $TiO_2$ provide excellent electron transport speeds, yet the nanometer particles show poor property of dispersion and are unstable, making them easy to aggregate and thus leading to lowering of electron transport rate and directly resulting in inhomogeneity of a film surface, thereby limiting the luminous efficiency of a device and reducing the life span of the device.

SUMMARY OF THE INVENTION

Objectives of the present invention are to provide a manufacturing method of an inverted quantum dot light-emitting diode (QD-LED), which overcomes the deficiencies of inhomogeneous film formation resulting from aggregation of $TiO_2$ nanometer particles, lowered electron transport efficiency, and low light extraction efficiency, so as to ensure high-efficiency electron transport rate of an electron transport layer, increase scattering of light to heighten light extraction efficiency, and improve luminous efficiency and stability of a device.

Objectives of the present invention are also to provide an inverted QD-LED, which demonstrates increased luminous efficiency and stability.

To achieve the above objectives, the present invention provides a manufacturing method of an inverted QD-LED, which comprises:

providing a backing plate and forming a cathode on the backing plate;

applying a hydrothermal synthesis process to form a monocrystalline $TiO_2$ nanorod array film on the cathode, wherein the monocrystalline $TiO_2$ nanorod array film comprises a plurality of monocrystalline $TiO_2$ nanorods that are grown vertically on the cathode and are arranged in an array and the monocrystalline $TiO_2$ nanorod array film serves as an electron transport layer;

forming a QD emissive layer on the electron transport layer;

forming a hole transport layer on the QD emissive layer;

forming a hole inject layer on the hole transport layer; and forming an anode on the hole inject layer.

The step of applying a hydrothermal synthesis process to form a monocrystalline $TiO_2$ nanorod array film on the cathode comprises: washing and cleaning a surface of the cathode, generating $TiO_2$ crystal seeds on the cathode through hydrolysis of tetrabutyl titanate or titanium isopropoxide, and providing conditions to allow reaction of hydrothermal synthesis to proceed such that the $TiO_2$ crystal seeds grow into a monocrystalline $TiO_2$ nanorod array film on the cathode through self-assembly directed growth, and wherein the monocrystalline $TiO_2$ nanorod array film has a film thickness that is between 100 nm and 500 nm.

A spin coating film forming process is adopted to form the QD emissive layer; the QD emissive layer is formed of a material that comprises a colloidal medium and electroluminescent QDs dispersed in the colloidal medium; the electroluminescent QDs comprise CdZnSe/ZnS, wherein CdZnSe serves as an emissive core and ZnS provides a protective shell; and the QD emissive layer has a film thickness that is between 20 nm and 50 nm.

A spin coating film forming process is adopted to form the hole transport layer; the hole transport layer is formed of a material that comprises polyvinylcarbazole; and the hole transport layer has a film thickness that is between 1 nm and 100 nm; and a spin coating film forming process is adopted to form the hole inject layer; the hole inject layer is formed of a material that comprises PEDOT:PSS; and the hole inject layer has a film thickness that is between 1 nm and 100 nm.

A magnetron sputtering film forming process is adopted to form the cathode; the cathode is formed of a material that comprises a transparent conductive metal oxide; and the cathode has a film thickness that is between 20 nm and 200 nm; and a vacuum vapor deposition process is adopted to form the anode; the anode is formed of a material that comprises aluminum; and the anode has a film thickness that is between 50 nm and 1000 nm.

The present invention also provides an inverted QD-LED, which comprises: a backing plate and a cathode, an electron transport layer, a QD emissive layer, a hole transport layer, a hole inject layer, and an anode that are stacked in sequence from bottom to top on the backing plate, wherein the electron transport layer comprises a monocrystalline $TiO_2$ nanorod array film, and the monocrystalline $TiO_2$ nanorod array film comprises a plurality of monocrystalline $TiO_2$ nanorods that are grown vertically on the cathode and are arranged in an array.

The monocrystalline $TiO_2$ nanorod array film has a film thickness that is between 100 nm and 500 nm.

The QD emissive layer is formed of a material that comprises a colloidal medium and electroluminescent QDs dispersed in the colloidal medium and the electroluminescent QDs comprise CdZnSe/ZnS, wherein CdZnSe serves as an emissive core, and ZnS provides a protective shell; and the QD emissive layer has a film thickness that is between 20 nm and 50 nm.

The hole transport layer is formed of a material that comprises polyvinylcarbazole and the hole transport layer has a film thickness that is between 1 nm and 100 nm; and the hole inject layer is formed of a material that comprises PEDOT:PSS and the hole inject layer has a film thickness that is between 1 nm and 100 nm.

The cathode is formed of a material that comprises the transparent conductive metal oxide and the cathode has a film thickness that is between 20 nm and 200 nm; and the anode is formed of a material that comprises aluminum and the anode has a film thickness that is between 50 nm and 1000 nm.

The present invention further provides a manufacturing method of an inverted QD-LED, which comprises:

providing a backing plate and forming a cathode on the backing plate;

applying a hydrothermal synthesis process to form a monocrystalline $TiO_2$ nanorod array film on the cathode, wherein the monocrystalline $TiO_2$ nanorod array film comprises a plurality of monocrystalline $TiO_2$ nanorods that are grown vertically on the cathode and are arranged in an array and the monocrystalline $TiO_2$ nanorod array film serves as an electron transport layer;

forming a QD emissive layer on the electron transport layer;

forming a hole transport layer on the QD emissive layer;

forming a hole inject layer on the hole transport layer; and forming an anode on the hole inject layer;

wherein the step of applying a hydrothermal synthesis process to form a monocrystalline $TiO_2$ nanorod array film on the cathode comprises: washing and cleaning a surface of the cathode, generating $TiO_2$ crystal seeds on the cathode through hydrolysis of tetrabutyl titanate or titanium isopropoxide, and providing conditions to allow reaction of hydrothermal synthesis to proceed such that the $TiO_2$ crystal seeds grow into a monocrystalline $TiO_2$ nanorod array film on the cathode through self-assembly directed growth, and wherein the monocrystalline $TiO_2$ nanorod array film has a film thickness that is between 100 nm and 500 nm;

wherein a spin coating film forming process is adopted to form the QD emissive layer; the QD emissive layer is formed of a material that comprises a colloidal medium and electroluminescent QDs dispersed in the colloidal medium; the electroluminescent QDs comprise CdZnSe/ZnS, wherein CdZnSe serves as an emissive core and ZnS provides a protective shell; and the QD emissive layer has a film thickness that is between 20 nm and 50 nm;

wherein a spin coating film forming process is adopted to form the hole transport layer; the hole transport layer is formed of a material that comprises polyvinylcarbazole; and the hole transport layer has a film thickness that is between 1 nm and 100 nm; and a spin coating film forming process is adopted to form the hole inject layer; the hole inject layer is formed of a material that comprises PEDOT:PSS; and the hole inject layer has a film thickness that is between 1 nm and 100 nm; and wherein a magnetron sputtering film forming process is adopted to form the cathode; the cathode is formed of a material that comprises a transparent conductive metal oxide; and the cathode has a film thickness that is between 20 nm and 200 nm; and a vacuum vapor deposition process is adopted to form the anode; the anode is formed of a material that comprises aluminum; and the anode has a film thickness that is between 50 nm and 1000 nm.

The efficacy of the present invention is that the present invention provides an inverted QD-LED and a manufacturing method thereof. The manufacturing method of an inverted QD-LED according to the present invention adopts a hydrothermal synthesis process to form a monocrystalline $TiO_2$ nanorod array film for serving as an electron transport layer, wherein a plurality of monocrystalline $TiO_2$ nanorods contained in the monocrystalline $TiO_2$ nanorod array film are arranged in an array so as not to readily get aggregated thereby overcoming the deficiencies of inhomogeneous film formation resulting from aggregation of $TiO_2$ nanometer particles, lowered electron transport efficiency, and low light extraction efficiency, and thus ensuring high-efficiency electron transport rate of the electron transport layer, increasing scattering of light to heighten light extraction efficiency, and improve luminous efficiency and stability of a device. The inverted QD-LED according to the present invention involves a monocrystalline $TiO_2$ nanorod array film to serve as an electron transport layer, and thus demonstrates increased luminous efficiency and stability.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
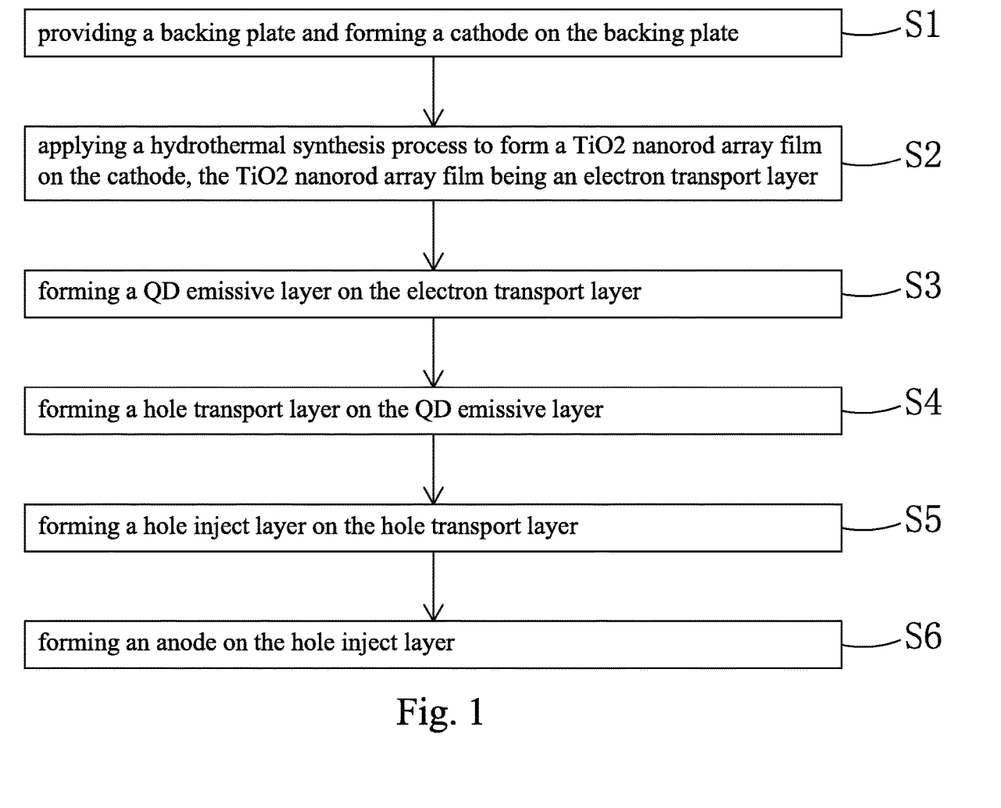
FIG. 1 is a flow chart illustrating a manufacturing method of an inverted quantum dot light-emitting diode (QD-LED) according to the present invention.
Figure 2:
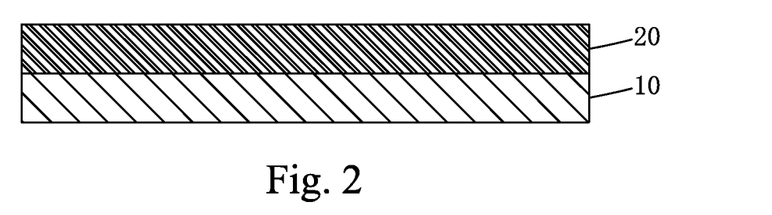
FIG. 2 is a schematic view illustrating Step S1 of the manufacturing method of the QD-LED according to the present invention.

Referring to FIG. 1, the present invention provides a manufacturing method of an inverted quantum dot light-emitting diode (QD-LED), which comprises the following steps:

Step S1: as shown in FIG. 2, providing a backing plate 10 and forming a cathode 20 on the backing plate 10

Specifically, the backing plate 10 comprises a flexible backing.

Specifically, a magnetron sputtering film forming process is adopted to form the cathode 20. The cathode 20 is formed of a material that comprises a transparent conductive metal oxide. The cathode 20 has a film thickness that is between 20 nm and 200 nm. Preferably, the transparent conductive metal oxide comprises indium tin oxide (ITO).

Figure 3:
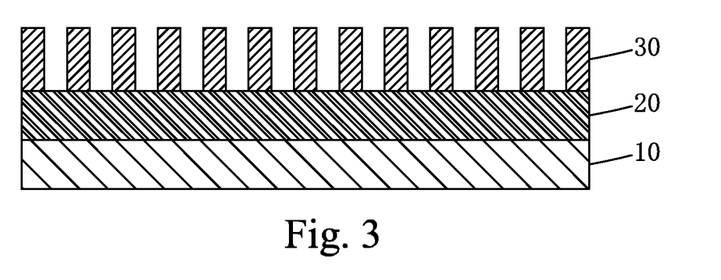
FIG. 3 is a schematic view illustrating Step S2 of the manufacturing method of the QD-LED according to the present invention.

Step S2: as shown in FIG. 3, applying a hydrothermal synthesis process to form a monocrystalline $TiO_2$ nanorod array film on the cathode 20, wherein the monocrystalline $TiO_2$ nanorod array film comprises a plurality of monocrystalline $TiO_2$ nanorods that are grown vertically on the cathode 20 and are arranged in an array and the monocrystalline $TiO_2$ nanorod array film serves as an electron transport layer 30.

Specifically, the step of applying a hydrothermal synthesis process to form a monocrystalline $TiO_2$ nanorod array film on the cathode 20 comprises: firstly, washing and cleaning a surface of the cathode 20, generating $TiO_2$ crystal seeds on the cathode 20 through hydrolysis of tetrabutyl titanate or titanium isopropoxide, and providing conditions to allow reaction of hydrothermal synthesis to proceed such that the $TiO_2$ crystal seeds grow into a monocrystalline $TiO_2$ nanorod array film on the cathode 20 through self-assembly directed growth.

Since monocrystalline $TiO_2$ nanorods, once grown excessively long, are readily susceptible to bending, controlling the time within which hydrothermal synthesis proceeds would allow for controlling of a thickness of the monocrystalline $TiO_2$ nanorod array film so grown, and thus controlling the length of the monocrystalline $TiO_2$ nanorods, guaranteeing the monocrystalline $TiO_2$ nanorods are grown vertically on the cathode 20. Preferably, the monocrystalline $TiO_2$ nanorod array film has a film thickness that is between 100 nm and 500 nm.

Figure 4:
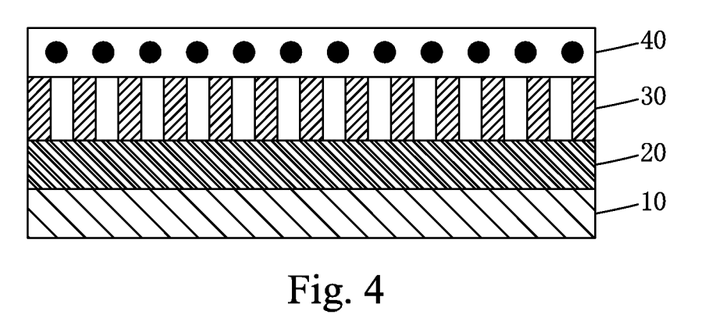
FIG. 4 is a schematic view illustrating Step S3 of the manufacturing method of the QD-LED according to the present invention.

Step S3: as shown in FIG. 4, forming a quantum dot (QD) emissive layer 40 on the electron transport layer 30.

Specifically, a spin coating film forming process is adopted to form the QD emissive layer 40. The QD emissive layer 40 is formed of a material that comprises a colloidal medium or colloidal body and electroluminescent QDs dispersed in the colloidal medium, wherein the electroluminescent QDs comprise CdZnSe/ZnS (zinc selenide cadmium/zinc sulfide), wherein CdZnSe serves as an emissive core, while ZnS provides a protective shell. The electroluminescent QDs have a quantum yield of 50%-80%. A half peak width of luminescence of the electroluminescent QDs is less than 30 nm. The QD emissive layer 40 has a film thickness that is between 20 nm and 50 nm.

Figure 5:
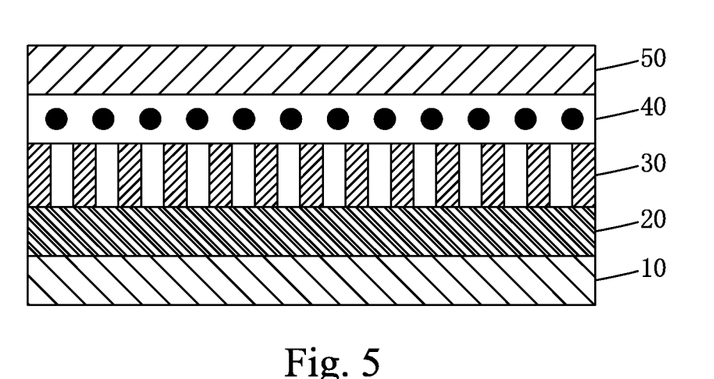
FIG. 5 is a schematic view illustrating Step S4 of the manufacturing method of the QD-LED according to the present invention.

Step S4: as shown in FIG. 5, forming a hole transport layer 50 on the QD emissive layer 40.

Specifically, a spin coating film forming process is adopted to form the hole transport layer 50. The hole transport layer 50 is formed of a material that comprises polyvinylcarbazole (PVK). The hole transport layer 50 has a film thickness that is between 1 nm and 100 nm.

Figure 6:
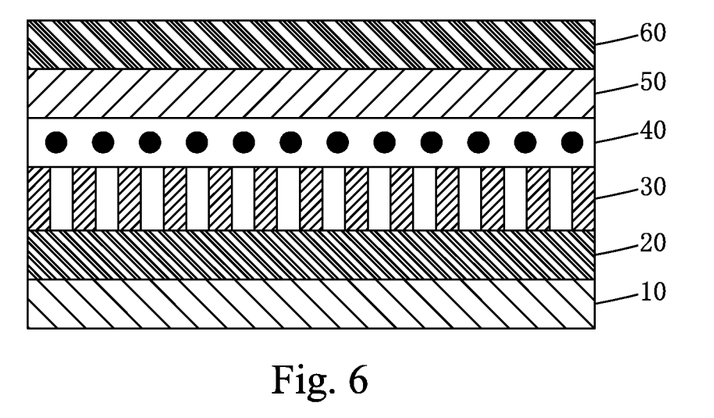
FIG. 6 is a schematic view illustrating Step S5 of the manufacturing method of the QD-LED according to the present invention.

Step S5: as shown in FIG. 6, forming a hole inject layer 60 on the hole transport layer 50.

Specifically, a spin coating film forming process is adopted to form the hole inject layer 60. The hole inject layer 60 is formed of a material that comprises PEDOT:PSS (polyphonic(3,4-ethylenedioxythiophene):poly(styrene-sulfonate)). The hole inject layer 60 has a film thickness that is between 1 nm and 100 nm.

Figure 7:
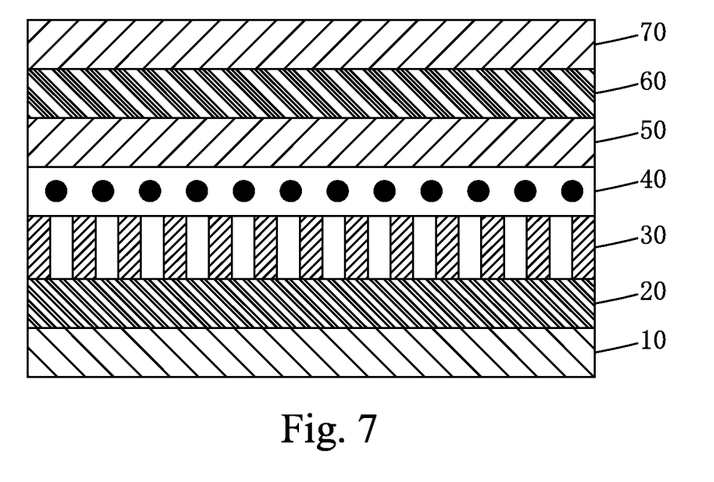
FIG. 7 is a schematic view illustrating Step S6 of the manufacturing method of the QD-LED according to the present invention and is also a schematic view illustrating the structure of a QD-LED according to the present invention.

Step S6: as shown in FIG. 7, forming an anode 70 on the hole inject layer 60.

Specifically, a vacuum vapor deposition process is adopted to form the anode 70. The anode 70 is formed of a material that comprises aluminum (Al). The anode 70 has a film thickness that is between 50 nm and 1000 nm.

The above-described manufacturing method of an inverted QD-LED adopts a hydrothermal synthesis process to form a monocrystalline $TiO_2$ nanorod array film for serving as an electron transport layer 30. A plurality of monocrystalline $TiO_2$ nanorods that are contained in the monocrystalline $TiO_2$ nanorod array film are arranged in an array so as not to readily get aggregated thereby overcoming the deficiencies of inhomogeneous film formation resulting from aggregation of $TiO_2$ nanometer particles, lowered electron transport efficiency, and low light extraction efficiency, and thus ensuring high-efficiency electron transport rate of the electron transport layer 30, increasing scattering of light to heighten light extraction efficiency, and improve luminous efficiency and stability of a device.

Based on the above-described manufacturing method of an inverted QD-LED, the present invention also provides an inverted QD-LED, which comprises: a backing plate 10 and a cathode 20, an electron transport layer 30, a QD emissive layer 40, a hole transport layer 50, a hole inject layer 60 and an anode 70 that are arranged in a manner of being stacked in sequence from top to bottom on the backing plate 10, wherein the electron transport layer 30 comprises a monocrystalline $TiO_2$ nanorod array film, and the monocrystalline $TiO_2$ nanorod array film comprises a plurality of monocrystalline $TiO_2$ nanorods that are grown vertically on the cathode 20 and are arranged in an array.

Specifically, the backing plate 10 comprises a flexible backing.

Specifically, the monocrystalline $TiO_2$ nanorod array film has a film thickness that is between 100 nm and 500 nm.

Specifically, the cathode 20 is formed of a material that comprises a transparent conductive metal oxide. The cathode 20 has a film thickness that is between 20 nm and 200 nm. Preferably, the transparent conductive metal oxide comprises indium tin oxide (ITO).

Specifically, the QD emissive layer 40 is formed of a material that comprises a colloidal medium or colloidal body and electroluminescent QDs dispersed in the colloidal medium, wherein the electroluminescent QDs comprise CdZnSe/ZnS (zinc selenide cadmium/zinc sulfide), wherein CdZnSe serves as an emissive core, while ZnS provides a protective shell. The electroluminescent QDs have a quantum yield of 50%-80%. A half peak width of luminescence of the electroluminescent QDs is less than 30 nm. The QD emissive layer 40 has a film thickness that is between 20 nm and 50 nm.

Specifically, the hole transport layer 50 is formed of a material that comprises polyvinylcarbazole (PVK), and the hole transport layer 50 has a film thickness that is between 1 nm and 100 nm.

Specifically, the hole inject layer 60 is formed of a material that comprises PEDOT:PSS (polyphonic(3,4-ethylenedioxythiophene):poly(styrene-sulfonate)), and the hole inject layer 60 has a film thickness that is between 1 nm and 100 nm.

Specifically, the anode 70 is formed of a material that comprises aluminum (Al), and the anode 70 has a film thickness that is between 50 nm and 1000 nm.

A traditional positively-arranged QD-LED often emits light from one side of an anode so that the anode is often selected as being formed of a transparent ITO material and a hole inject layer is selected as being formed of a transparent PEDOT:PSS material. However, a PEDOT:PSS film and an ITO film formed through spin coating may have poor interfacing contact characteristics and in addition, long contact with PEDOT:PSS may cause corrosion to ITO and consequently, poor luminous stability and shortened lifespan of the QD-LED might result. Further, in the inverted QD-LED according to the present invention, the ITO material of the cathode and the PEDOT:PSS material of the hole inject layer are not in contact with each other so that this issue can be avoided thereby helping increase hole transport performance of the QD-LED. Further, opposite to the positively-arranged QD-LED that requires use of a PEDOT:PSS material to make the hole inject layer, the inverted QD-LED of the present invention may be structured such that not only a PEDOT:PSS material can be used to form the hole inject layer through spin coating, other materials may also be used, by means of vapor deposition that is a more mature technique, to make the hole inject layer to thereby improve the hole transport performance.

The above-described inverted QD-LED involves a monocrystalline $TiO_2$ nanorod array film to serve as an electron transport layer 30, wherein a plurality of monocrystalline $TiO_2$ nanorods contained in the monocrystalline $TiO_2$ nanorod array film is arranged in an array so as not to not to readily get aggregated thereby overcoming the deficiencies of inhomogeneous film formation resulting from aggregation of $TiO_2$ nanometer particles, lowered electron transport efficiency, and low light extraction efficiency, and thus ensuring high-efficiency electron transport rate of the electron transport layer 30, increasing scattering of light to heighten light extraction efficiency, and improve luminous efficiency and stability of a device.

In summary, the present invention provides an inverted QD-LED and a manufacturing method thereof. The manufacturing method of an inverted QD-LED according to the present invention adopts a hydrothermal synthesis process to form a monocrystalline $TiO_2$ nanorod array film for serving as an electron transport layer, wherein a plurality of monocrystalline $TiO_2$ nanorods contained in the monocrystalline $TiO_2$ nanorod array film are arranged in an array so as not to readily get aggregated thereby overcoming the deficiencies of inhomogeneous film formation resulting from aggregation of $TiO_2$ nanometer particles, lowered electron transport efficiency, and low light extraction efficiency, and thus ensuring high-efficiency electron transport rate of the electron transport layer, increasing scattering of light to heighten light extraction efficiency, and improve luminous efficiency and stability of a device. The inverted QD-LED according to the present invention involves a monocrystalline $TiO_2$ nanorod array film to serve as an electron transport layer, and thus demonstrates increased luminous efficiency and stability.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A manufacturing method of an inverted quantum dot light-emitting diode (QD-LED), comprising:
   providing a backing plate and forming a cathode on the backing plate;
   applying a hydrothermal synthesis process to form a monocrystalline $TiO_2$ nanorod array film on the cathode, wherein the monocrystalline $TiO_2$ nanorod array film comprises a plurality of monocrystalline $TiO_2$ nanorods that are grown vertically on the cathode and are arranged in an array and the monocrystalline $TiO_2$ nanorod array film serves as an electron transport layer;
   forming a quantum dot (QD) emissive layer on the electron transport layer;
   forming a hole transport layer on the QD emissive layer;
   forming a hole inject layer on the hole transport layer; and
   forming an anode on the hole inject layer,
   wherein the plurality of monocrystalline $TiO_2$ nanorods are directly grown on the cathode by having $TiO_2$ crystal seeds generated on the cathode, such that the QD emissive layer that is formed on the electrode transport layer is located atop the plurality of monocrystalline $TiO_2$ nanorods that are directly grown on the cathode to be spaced from the cathode.

2. The manufacturing method of an inverted QD-LED as claimed in claim 1, wherein the step of applying a hydrothermal synthesis process to form a monocrystalline $TiO_2$ nanorod array film on the cathode comprises: washing and cleaning a surface of the cathode, generating the $TiO_2$ crystal seeds on the cathode through hydrolysis of tetrabutyl titanate or titanium isopropoxide, and providing conditions to allow reaction of hydrothermal synthesis to proceed such that the $TiO_2$ crystal seeds grow into a monocrystalline $TiO_2$ nanorod array film on the cathode through self-assembly directed growth, and wherein the monocrystalline $TiO_2$ nanorod array film has a film thickness that is between 100 nm and 500 nm.

3. The manufacturing method of an inverted QD-LED as claimed in claim 1, wherein a spin coating film forming process is adopted to form the QD emissive layer; the QD emissive layer is formed of a material that comprises a colloidal medium and electroluminescent QDs dispersed in the colloidal medium; the electroluminescent QDs comprise CdZnSe/ZnS, wherein CdZnSe serves as an emissive core and ZnS provides a protective shell; and the QD emissive layer has a film thickness that is between 20 nm and 50 nm.

4. The manufacturing method of an inverted QD-LED as claimed in claim 1, wherein a spin coating film forming process is adopted to form the hole transport layer; the hole transport layer is formed of a material that comprises polyvinylcarbazole; and the hole transport layer has a film thickness that is between 1 nm and 100 nm; and
   a spin coating film forming process is adopted to form the hole inject layer; the hole inject layer is formed of a material that comprises PEDOT:PSS; and the hole inject layer has a film thickness that is between 1 nm and 100 nm.

5. The manufacturing method of an inverted QD-LED as claimed in claim 1, wherein a magnetron sputtering film forming process is adopted to form the cathode; the cathode is formed of a material that comprises a transparent conductive metal oxide; and the cathode has a film thickness that is between 20 nm and 200 nm; and a vacuum vapor deposition process is adopted to form the anode; the anode is formed of a material that comprises aluminum; and the anode has a film thickness that is between 50 nm and 1000 nm.

6. A manufacturing method of an inverted quantum dot light-emitting diode (QD-LED), comprising:

providing a backing plate and forming a cathode on the backing plate;

applying a hydrothermal synthesis process to form a monocrystalline $TiO_2$ nanorod array film on the cathode, wherein the monocrystalline $TiO_2$ nanorod array film comprises a plurality of monocrystalline $TiO_2$ nanorods that are grown vertically on the cathode and are arranged in an array and the monocrystalline $TiO_2$ nanorod array film serves as an electron transport layer;

forming a quantum dot (QD) emissive layer on the electron transport layer;

forming a hole transport layer on the QD emissive layer; forming a hole inject layer on the hole transport layer; and forming an anode on the hole inject layer, wherein the plurality of monocrystalline $TiO_2$ nanorods are directly grown on the cathode by having $TiO_2$ crystal seeds generated on the cathode, such that the QD emissive layer that is formed on the electrode transport layer is located atop the plurality of monocrystalline $TiO_2$ nanorods that are directly grown on the cathode to be spaced from the cathode;

wherein the step of applying a hydrothermal synthesis process to form a monocrystalline $TiO_2$ nanorod array film on the cathode comprises: washing and cleaning a surface of the cathode, generating the $TiO_2$ crystal seeds on the cathode through hydrolysis of tetrabutyl titanate or titanium isopropoxide, and providing conditions to allow reaction of hydrothermal synthesis to proceed such that the $TiO_2$ crystal seeds grow into a monocrystalline $TiO_2$ nanorod array film on the cathode through self-assembly directed growth, and wherein the monocrystalline $TiO_2$ nanorod array film has a film thickness that is between 100 nm and 500 nm;

wherein a spin coating film forming process is adopted to form the QD emissive layer; the QD emissive layer is formed of a material that comprises a colloidal medium and electroluminescent QDs dispersed in the colloidal medium; the electroluminescent QDs comprise CdZnSe/ZnS, wherein CdZnSe serves as an emissive core and ZnS provides a protective shell; and the QD emissive layer has a film thickness that is between 20 nm and 50 nm;

wherein a spin coating film forming process is adopted to form the hole transport layer; the hole transport layer is formed of a material that comprises polyvinylcarbazole; and the hole transport layer has a film thickness that is between 1 nm and 100 nm; and a spin coating film forming process is adopted to form the hole inject layer; the hole inject layer is formed of a material that comprises PEDOT:PSS; and the hole inject layer has a film thickness that is between 1 nm and 100 nm; and wherein a magnetron sputtering film forming process is adopted to form the cathode; the cathode is formed of a material that comprises a transparent conductive metal oxide; and the cathode has a film thickness that is between 20 nm and 200 nm; and a vacuum vapor deposition process is adopted to form the anode; the anode is formed of a material that comprises aluminum; and the anode has a film thickness that is between 50 nm and 1000 nm.

* * * * *